United States Patent
Nagata et al.

(10) Patent No.: US 10,177,276 B2
(45) Date of Patent: Jan. 8, 2019

(54) GROUP III NITRIDE SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventors: Kengo Nagata, Kiyosu (JP); Taiji Yamamoto, Kiyosu (JP)

(73) Assignee: TOYODA GOSEI CO., LTD., Kiyosu-Shi, Aichi-ken (JP)

( * ) Notice: Subject to any disclaimer, the term of this patent is extended or adjusted under 35 U.S.C. 154(b) by 0 days.

(21) Appl. No.: 15/642,142

(22) Filed: Jul. 5, 2017

(65) Prior Publication Data

US 2018/0019374 A1    Jan. 18, 2018

(30) Foreign Application Priority Data

Jul. 18, 2016 (JP) .................................. 2016-140964

(51) Int. Cl.
| | |
|---|---|
| H01L 29/06 | (2006.01) |
| H01L 33/12 | (2010.01) |
| H01L 33/00 | (2010.01) |
| H01L 33/06 | (2010.01) |
| H01L 33/14 | (2010.01) |
| H01L 33/24 | (2010.01) |
| H01L 33/32 | (2010.01) |

(52) U.S. Cl.
CPC ............ H01L 33/12 (2013.01); H01L 33/007 (2013.01); H01L 33/06 (2013.01); H01L 33/145 (2013.01); H01L 33/24 (2013.01); H01L 33/32 (2013.01)

(58) Field of Classification Search
CPC ....... H01L 33/025; H01L 33/04; H01L 33/06; H01L 33/12; H01L 33/24; H01L 33/32

USPC ............................................... 257/13, 15, 18
See application file for complete search history.

(56) References Cited

U.S. PATENT DOCUMENTS

| | | | |
|---|---|---|---|
| 6,958,497 B2 | 10/2005 | Emerson et al. | |
| 7,193,246 B1 | 3/2007 | Tanizawa et al. | |
| 2012/0168753 A1* | 7/2012 | Sanga | H01L 33/02 257/52 |
| 2013/0037779 A1* | 2/2013 | Takeoka | H01L 33/025 257/13 |

(Continued)

FOREIGN PATENT DOCUMENTS

| | | |
|---|---|---|
| JP | 2000-232236 A | 8/2000 |
| JP | 2009-260398 A | 11/2009 |

*Primary Examiner* — Matthew E Warren

(74) *Attorney, Agent, or Firm* — McGinn IP Law Group, PLLC

(57) ABSTRACT

There is provided a Group III nitride semiconductor light-emitting device exhibiting improved crystallinity while suppressing abnormal growth of semiconductor layer due to pits and a production method therefor. In forming an n-side electrostatic breakdown preventing layer, pits are generated from the n-side electrostatic breakdown preventing layer. In forming an n-side superlattice layer, the layer is formed by alternately depositing a first InGaN layer and a GaN layer having an In composition ratio lower than that of the first InGaN layer, so that the In composition ratio and the total thickness of the first InGaN layers satisfy the following equation: $0 < Y \leq 180X+22$, $0 < X \leq 0.1$, X: In composition ratio of InGaN layers, and Y: Total thickness of InGaN layers (nm).

12 Claims, 9 Drawing Sheets

(56) References Cited

U.S. PATENT DOCUMENTS

2015/0221826 A1* 8/2015 Yang ................... H01L 33/24
                                                      257/13
2016/0276537 A1* 9/2016 Nakamura ............ H01L 33/24

* cited by examiner

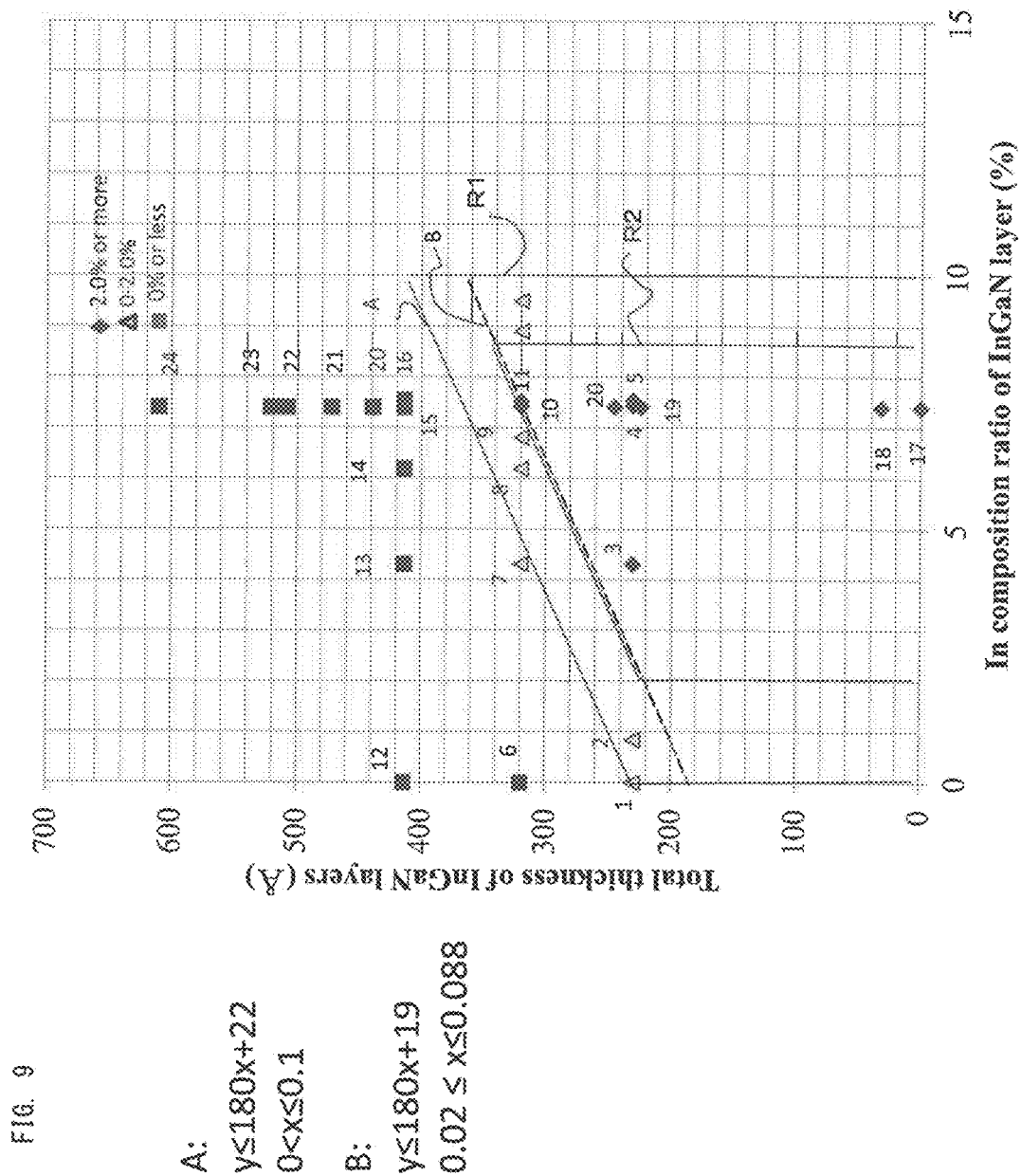

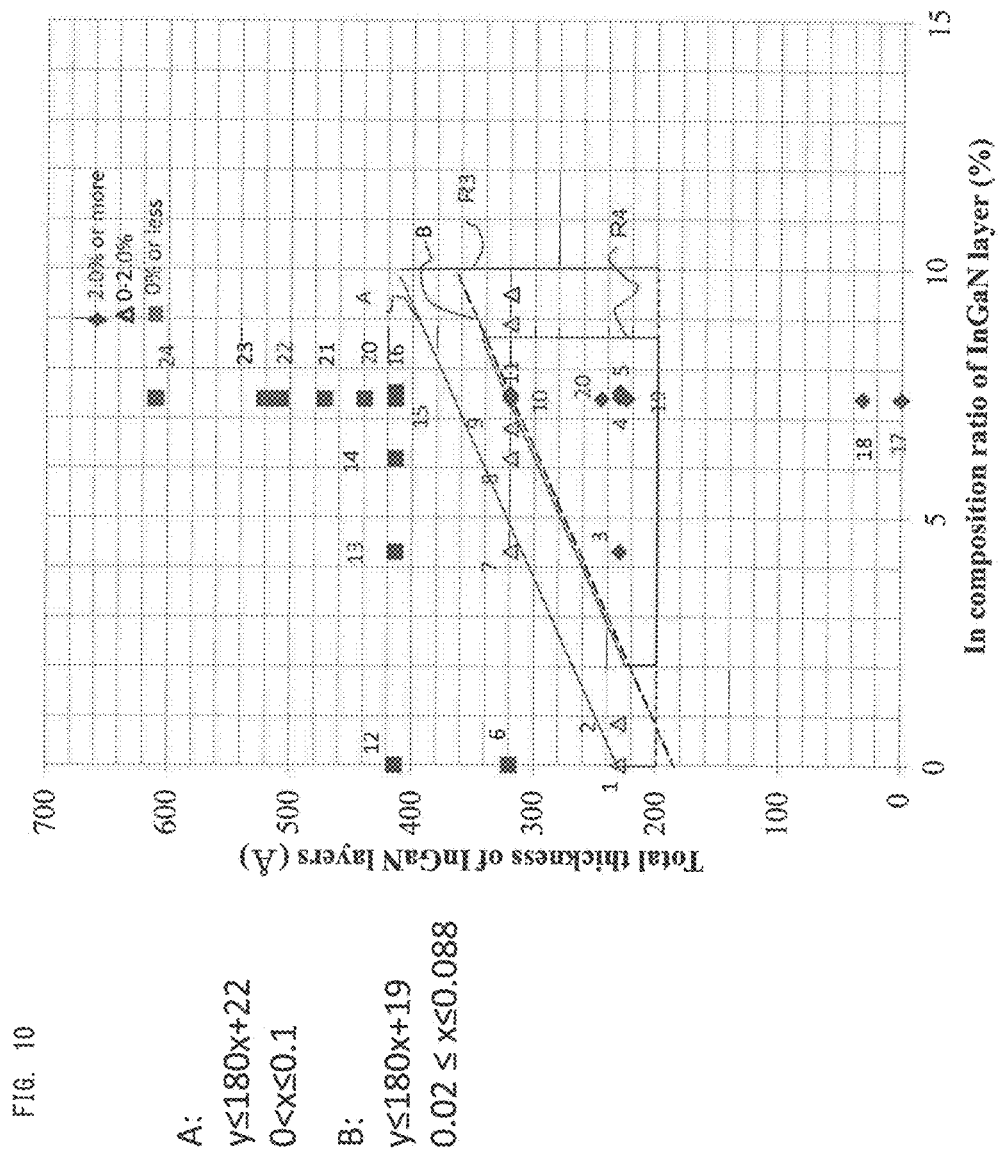

GROUP III NITRIDE SEMICONDUCTOR LIGHT-EMITTING DEVICE AND PRODUCTION METHOD THEREFOR

BACKGROUND OF THE INVENTION

Field of the Invention

The present techniques relate to a Group III nitride semiconductor light-emitting device intended for relaxing stress applied to a light-emitting layer, and a production method therefor.

Background Art

Some semiconductor light-emitting devices have an n-type semiconductor layer, a light-emitting layer, and a p-type semiconductor layer. The light-emitting layer is a layer which emits light through recombination of holes and electrons. Stress is sometimes applied to the light-emitting layer from the n-type semiconductor layer and the p-type semiconductor layer between which the light-emitting layer is interposed. When stress is applied to the light-emitting layer, the light-emitting layer is distorted accordingly. The overlapping of wave functions of electrons and holes in the light-emitting layer is reduced, thereby decreasing the recombination rate of electrons and holes. That is, the light quantity of the semiconductor light-emitting device is reduced.

To relax the stress applied to the light-emitting layer, the techniques to form an n-side superlattice layer in the n-type semiconductor layer have been developed. For example, Japanese Patent Application Laid-Open (kokai) No. 2009-260398 discloses an n-side superlattice layer which is an alternating layer of $In_XGa_{1-X}N$ (first layer) and $In_XGa_{1-X}N$ (second layer), wherein the thickness of the first layer is half the thickness of the second layer, and the total thickness of the first layer and the second layer is less than 70 Å.

When a plurality of pits is formed at least from the n-type semiconductor layer to the light-emitting layer, stress applied to the light-emitting layer can be further relaxed. When pits are formed in the semiconductor layer, the semiconductor layer may be abnormally grown with the pits as starting points. Therefore, a Group III nitride semiconductor light-emitting device exhibiting improved crystallinity while suppressing abnormal growth of semiconductor layer due to pits and a production method therefor are expected.

SUMMARY OF THE INVENTION

The present techniques have been conceived in order to solve the aforementioned problems involved in conventional techniques. Thus, an object of the present techniques is to provide a Group III nitride semiconductor light-emitting device exhibiting improved crystallinity while suppressing abnormal growth of semiconductor layer due to pits and a production method therefor.

In a first aspect of the present techniques, there is provided a method for producing a Group III nitride semiconductor light-emitting device, the method comprising forming an n-type semiconductor layer on a substrate, forming a light-emitting layer on the n-type semiconductor layer, and forming a p-type semiconductor layer on the light-emitting layer. The forming an n-type semiconductor layer comprises forming an n-type contact layer, forming an n-side electrostatic breakdown preventing layer on the n-type contact layer, and forming an n-side superlattice layer on the n-side electrostatic breakdown preventing layer. In the forming an n-side electrostatic breakdown preventing layer, a plurality of pits is generated from the n-side electrostatic breakdown preventing layer. In the forming an n-side superlattice layer, a first InGaN layer and a second InGaN layer having an In composition ratio lower than that of GaN layer or the first InGaN layer are alternately formed and the In composition ratio and the total thickness of the first InGaN layers satisfy the following equation:

$$0 < Y \leq 180X + 22$$

$$0 < X \leq 0.1$$

X: In composition ratio of first InGaN layers
Y: Total thickness of first InGaN layers (nm)

In the method for producing the Group III nitride semiconductor light-emitting device, semiconductor layer with high crystallinity can be grown while suppressing abnormal growth of semiconductor layer due to pits. Therefore, the total radiant flux of the semiconductor light-emitting device is high.

A second aspect of the present techniques is drawn to a specific embodiment of the production method, wherein in the forming an n-side superlattice layer, the In composition ratio and the total thickness of the first InGaN layers satisfy the following equation:

$$0 < Y \leq 180X + 19$$

$$0.02 \leq X \leq 0.088$$

A third aspect of the present techniques is drawn to a specific embodiment of the production method, wherein in the forming an n-side superlattice layer, the total thickness of the first InGaN layers is not less than 20 nm.

A fourth aspect of the present techniques is drawn to a specific embodiment of the production method, wherein in the forming an n-side electrostatic breakdown preventing layer, the average pit diameter at an interface between the n-side electrostatic breakdown preventing layer and the n-side superlattice layer is 120 nm to 200 nm.

A fifth aspect of the present techniques is drawn to a specific embodiment of the production method, wherein in the forming an n-side electrostatic breakdown preventing layer, the pit density at an interface between the n-side electrostatic breakdown preventing layer and the n-side superlattice layer is $1.0 \times 10^8$ cm$^{-3}$ to $4.0 \times 10^8$ cm$^{-3}$.

A sixth aspect of the present techniques is drawn to a specific embodiment of the production method, wherein the wavelength of light emitted from the light-emitting layer is 430 nm to 470 nm.

In a seventh aspect of the present techniques, there is provided a Group III nitride semiconductor light-emitting device, the Group III nitride semiconductor light-emitting device comprises an n-type semiconductor layer on a substrate, a light-emitting layer on the n-type semiconductor layer, and a p-type semiconductor layer on the light-emitting layer. The n-type semiconductor layer comprises an n-type contact layer, an n-side electrostatic breakdown preventing layer, and an n-side superlattice layer in this order on the substrate. At least the n-type semiconductor layer and the light-emitting layer have a plurality of pits starting from the n-side electrostatic breakdown preventing layer. The n-side superlattice layer is formed by alternately depositing a first InGaN layer, and a GaN layer or a second InGaN layer having an In composition ratio lower than that of the first InGaN layer. The In composition ratio and the total thickness of the first InGaN layers satisfy the following equation:

$0 < Y \leq 180X+22$ $0 < X \leq 0.1$

X: In composition ratio of first InGaN layers
Y: Total thickness of first InGaN layers (nm)

An eighth aspect of the present techniques is drawn to a specific embodiment of the Group III nitride semiconductor light-emitting device, wherein the In composition ratio and the total thickness of the first InGaN layers satisfy the following equation:

$0 < Y \leq 180X+19$ $0.02 \leq X \leq 0.088$

The present techniques, disclosed in the specification, provide a Group III nitride semiconductor light-emitting device exhibiting improved crystallinity while suppressing abnormal growth of semiconductor layer due to a pit, and a production method therefor.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which:

FIG. 9 is a graph (part 1) showing the relationship among the In composition ratio and the total thickness of InGaN layers in the n-side superlattice layer and the total radiant flux; and FIG. 10 is a graph (part 2) showing the relationship among the In composition ratio and the total thickness of InGaN layers in the n-side superlattice layer and the total radiant flux.

DETAILED DESCRIPTION OF PREFERRED EMBODIMENT

Figure 1:
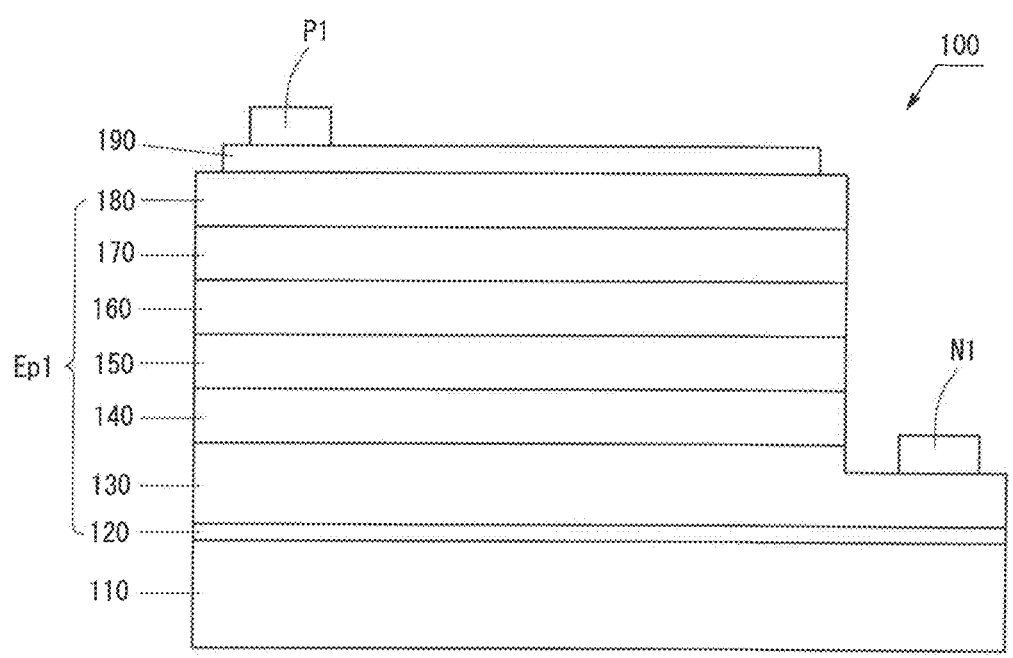
FIG. 1 is a schematic view showing the structure of a light-emitting device according to an embodiment.

With reference to the drawings, specific embodiment of the production method for producing a semiconductor light-emitting device as an example will next be described in detail. However, this embodiment should not be construed as limiting the techniques thereto. The below-described layered structure of the layers of the semiconductor light-emitting device and the electrode structure are given only for the illustration purpose, and other layered structures differing therefrom may also be employed. The thickness of each of the layers shown in the drawings is not an actual value, but a conceptual value. The below-described pit size is illustrated larger than the actual size.

1. Semiconductor Light-emitting Device

Figure 2:
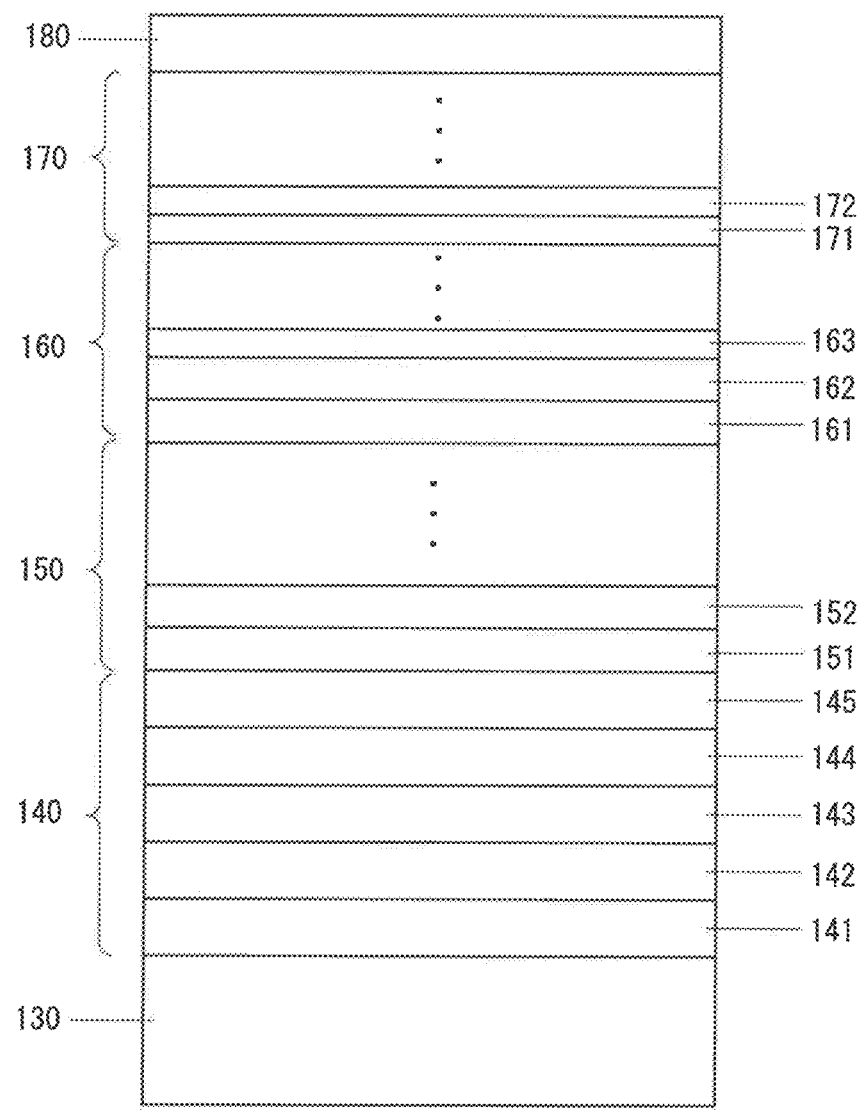
FIG. 2 is a sketch showing a layered structure of semiconductor layer in a light-emitting device according to an embodiment.

FIG. 1 is a schematic view showing the structure of a light-emitting device 100 according to the present embodiment. FIG. 2 is a sketch showing a layered structure of semiconductor layer in the light-emitting device 100. The light-emitting device 100 is a face-up type semiconductor light-emitting device. The light-emitting device 100 has a plurality of Group III nitride semiconductor layers. The emission wavelength of the light-emitting device 100 is 430 nm to 470 nm.

As shown in FIG. 1, the light-emitting device 100 has a substrate 110, a low temperature buffer layer 120, an n-type contact layer 130, an n-side electrostatic breakdown preventing layer 140, an n-side superlattice layer 150, a light-emitting layer 160, a p-type cladding layer 170, a p-type contact layer 180, a transparent electrode 190, an n-electrode N1, and a p-electrode P1. The low temperature buffer layer 120, the n-type contact layer 130, the n-side electrostatic breakdown preventing layer 140, the n-side superlattice layer 150, the light-emitting layer 160, the p-type cladding layer 170, and the p-type contact layer 180 constitute a semiconductor layer Ep1. The n-type contact layer 130, the n-side electrostatic breakdown preventing layer 140, and the n-side superlattice layer 150 are made of an n-type semiconductor. The p-type cladding layer 170 and the p-type contact layer 180 are made of a p-type semiconductor layer. The n-type semiconductor layer may include an ud-GaN ("ud" means unintentionally doped, or un-doped) layer not doped with a donor. The p-type semiconductor layer may include an ud-GaN layer not doped with an acceptor.

On the main surface of the substrate 110, the semiconductor layer Ep1 is formed by depositing the low temperature buffer layer 120, the n-type contact layer 130, the n-side electrostatic breakdown preventing layer 140, the n-side superlattice layer 150, the light-emitting layer 160, the p-type cladding layer 170, and the p-type contact layer 180 in order from the substrate 110 side. The n-electrode N1 is formed on the n-type contact layer 130. The p-electrode P1 is formed on the transparent electrode 190.

The substrate 110 is a growth substrate. On the main surface of the substrate, the semiconductor layer Ep1 is formed through MOCVD. The main surface of the substrate 110 may be roughened. The substrate 110 is made of sapphire. Other than sapphire, materials such as SiC, ZnO, Si, and GaN may be employed.

The low-temperature buffer layer 120 takes over the crystal construction from the substrate 110 and is provided so as to form thereon an upper layer. Thus, the low-temperature buffer layer 120 is formed on the main surface of the substrate 110. The low-temperature buffer layer 120 is made of, for example, AlN or GaN.

The n-type contact layer 130 is provided so as to establish ohmic contact with the n-electrode N1. The n-type contact layer 130 is formed on the low-temperature buffer layer 120. On the n-type contact layer 130, the n-electrode N1 is disposed. The n-type contact layer 130 is formed of n-type GaN and has a Si concentration of $1\times10^{18}/cm^3$ or higher.

Alternatively, the n-type contact layer 130 may be formed of a plurality of layers having different carrier concentrations for enhancing ohmic contact with the n-electrode N1. The n-type contact layer 130 has a thickness of, for example, 1,000 nm to 10,000 nm. Needless to say, no particular limitation is imposed on the thickness.

The n-side electrostatic breakdown-preventing layer 140 serves as an electrostatic breakdown-preventing layer for preventing electrostatic breakdown of the semiconductor layers. The n-side electrostatic breakdown-preventing layer 140 is formed on the n-type contact layer 130. As shown in FIG. 2, the n-side electrostatic breakdown preventing layer 140 comprises an n-type GaN layer 141, an n-type AlGaN layer 142, an ud-AlGaN layer 143, an ud-GaN layer 144, and an n-type GaN layer 145. The Al composition of the n-type AlGaN layer 142 is, for example, 0.04 to 0.30. The Al composition of the n-type AlGaN layer 142 is preferably, 0.04 to 0.20, and more preferably, 0.07 to 0.20. The donor concentration of the ud-AlGaN layer 143 is $5 \times 10^{17}/cm^3$. The ud-GaN layer 144 is the same as the ud-AlGaN layer 143 except for that Al is not contained. [0025]

The n-type GaN layer 141 is formed on the n-type contact layer 130. The n-type AlGaN layer 142 is formed on the n-type GaN layer 141. The ud-AlGaN layer 143 is formed on the n-type AlGaN layer 142. The ud-GaN layer 144 is formed on the ud-AlGaN layer 143. The n-type GaN layer 145 is formed on the ud-GaN layer 144. That is, the n-type GaN layer 141, the n-type AlGaN layer 142, the ud-AlGaN layer 143, the ud-GaN layer 144, and the n-type GaN layer 145 are formed in this order on the side most distal from the light-emitting layer 160.

The thickness of the n-type GaN layer 141 is 300 nm to 1,000 nm. The thickness of the n-type AlGaN layer 142 is 1 nm to 130 nm. The thickness of the ud-AlGaN layer 143 is 50 nm to 500 nm. The thickness of the ud-GaN layer 144 is 10 nm to 300 nm. The thickness of the n-type GaN layer 145 is 10 nm to 100 nm. These thicknesses are merely examples, and other thickness values may be acceptable The n-side superlattice layer 150 is a strain relaxation layer for relaxing stress applied to the light-emitting layer 160. More specifically, the n-side superlattice layer 150 is a superlattice layer having a superlattice structure. The n-side superlattice layer 150 is formed on the n-side electrostatic breakdown preventing layer 140. As shown in FIG. 2, the n-side superlattice layer 150 is formed by repeatedly depositing an InGaN layer 151 and a GaN layer 152. The number of repetitions is 5 to 20. The number of repetitions may be any other number. The thickness of each InGaN layer 151 is 0.3 nm to 10 nm, and more preferably, 5 nm to 9 nm. The thickness of each GaN layer 152 is 0.3 nm to 10 nm, and more preferably, 5 nm to 9 nm. These thicknesses are merely examples, and other thickness values may be acceptable.

The light-emitting layer 160 emits light through recombination of electrons and holes. The light-emitting layer 160 is formed on the n-side superlattice layer 150. As shown in FIG. 2, the light-emitting layer 160 is formed by repeatedly depositing layer units, each layer unit comprising a well layer 161, a capping layer 162, and a barrier layer 163. That is, the light-emitting layer 160 has a multi-quantum well structure (MQW structure). The capping layer 162 is a protective layer for protecting the well layer 161 from heat. For example, the capping layer 162 serves to prevent In from sublimating from the well layer 161.

The number of repetitions is, for example, 5 to 20. Needless to say, the number of repetitions may be any other number. The well layer 161 is an InGaN layer. The capping layer 162 is, for example, a GaN layer. The barrier layer 163 is an AlGaN layer. The Al composition of the barrier layer 163 is approximately 7%. In this case, the light-emitting device 100 has high light output. These materials are merely examples, and the semiconductor layers may be made of semiconductor having other compositions. For example, the barrier layer 163 may be a GaN layer.

The thickness of the well layer 161 is 1 nm to 5 nm. The thickness of the capping layer 162 is 0.2 nm to 1.8 nm. The thickness of the barrier layer 163 is 1 nm to 10 nm. These thicknesses are merely examples, and other thickness range may be employed. The total thickness of the light-emitting layer 160 is 500 nm to 1,000 nm. Needless to say, other thickness range may be acceptable.

The p-type cladding layer 170 is formed on the light-emitting layer 160. As shown in FIG. 2, the p-type cladding layer 170 is formed by repeatedly depositing a p-type InGaN layer 171 and a p-type AlGaN layer 172. The number of repetitions is, for example, 5 to 20. Needless to say, the number of repetitions may be any other number. The In composition ratio of the p-type InGaN layer 171 is 0.05 to 0.30. The thickness of the p-type InGaN layer 171 is 0.2 nm to 5 nm. The Al composition ratio of the p-type AlGaN layer 172 is 0.10 to 0.4. The thickness of the p-type AlGaN layer 172 is 1 nm to 5 nm. These thicknesses are merely examples, and other thickness values may be acceptable. The p-type cladding layer 170 may have a structure different from the above.

The p-type contact layer 180 is formed on the p-type cladding layer 170. The thickness of the p-type contact layer 180 is 10 nm to 100 nm. The p-type contact layer 180 is doped with Mg at a concentration of $1 \times 10^{19}/cm^3$ to $1 \times 10^{22}/cm^3$.

The transparent electrode 190 is formed on the p-type contact layer 180. The transparent electrode 190 may be made of any one of ITO, IZO, ICO, ZnO, $TiO_2$, $NbTiO_2$, $TaTiO_2$, and $SnO_2$.

The p-electrode P1 is formed on the transparent electrode 190. The p-electrode P1 is formed by depositing Ni and Au in order on the transparent electrode 190. Needless to say, other structure may be used.

The n-electrode N1 is formed on the n-type contact layer 130. The n-electrode N1 is formed by depositing V and Al in order from the n-type contact layer 130 side. Alternatively, Ti and Al may be deposited in order. Needless to say, other structure may be used.

The light-emitting device 100 may have a protective film for protecting the semiconductor layer Ep1.

2. Pit 2-1. Pit Structure

Figure 3:
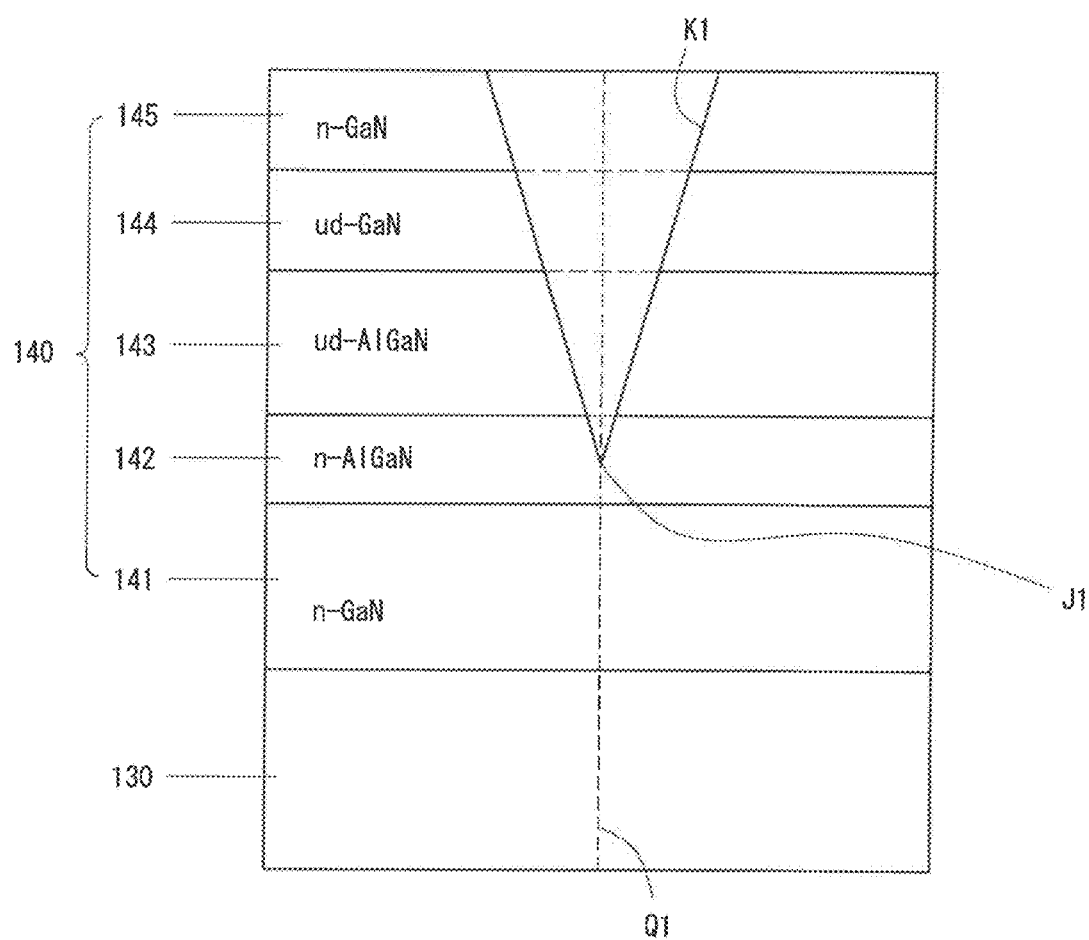
FIG. 3 is a sketch for describing pits formed in the light-emitting device according to the embodiment.

FIG. 3 is a sketch showing the pit K1 of the light-emitting device 100. The light-emitting device 100 has pits K1 reaching from the n-type semiconductor layer to the p-type semiconductor layer. That is, at least the n-type semiconductor layer and the light-emitting layer 160 have a plurality of pits K1 starting from the n-side electrostatic breakdown preventing layer 140. In FIG. 3, a part of the n-type semiconductor layer is illustrated. The pit K1 is formed from threading dislocation Q1 when growing the semiconductor layer Ep1 of the light-emitting device 100. The pit K1 is grown from the n-type AlGaN layer 142 of the n-side electrostatic breakdown preventing layer 140. That is, threading dislocation grown upward from the substrate 110 expands laterally, i.e., perpendicularly to the growth direction of threading dislocation inside the film of the n-side electrostatic breakdown preventing layer 140, resulting in the pit K1. The pit K1 is grown until it reaches the p-type contact layer 180.

The pit K1 starts to grow from a starting point J1 of the threading dislocation Q1. The semiconductor layer actually has a large number of pits K1. The starting point J1 of the pit K1 exists in the n-type AlGaN layer 142. That is, the n-type AlGaN layer 142 includes the starting points J1 of the large number of pits K1. The starting points J1 of these large number of pits K1 are positioned at almost the same depths in the n-type AlGaN layer 142.

The pit diameter of the pit K1 varies depending on the thickness of the n-side electrostatic breakdown preventing layer 140 and the growth temperature of the n-side electrostatic breakdown preventing layer 140. The larger the thickness of the n-side electrostatic breakdown preventing layer 140, the larger the pit diameter. On the contrary, the smaller the thickness of the n-side electrostatic breakdown preventing layer 140, the smaller the pit diameter. The higher the growth temperature of the n-side electrostatic breakdown preventing layer 140, the smaller the pit diameter. On the contrary, the lower the growth temperature of the n-side electrostatic breakdown preventing layer 140, the larger the pit diameter.

The average pit diameter of the pits K1 at an interface between the n-side electrostatic breakdown preventing layer 140 and the n-side superlattice layer 150 is 120 nm to 200 nm. The pit density of the pits K1 at an interface between the n-side electrostatic breakdown preventing layer 140 and the n-side superlattice layer 150 is $1.0 \times 10^8$ cm$^{-3}$ to $4.0 \times 10^8$ cm$^{-3}$. These are merely examples, and the above indices may be any other values.

The pit K1 is the n-type AlGaN layer 142 having a higher resistance than the GaN layer, and carriers are difficult to enter the pits K1. That is, non-light-emitting recombination can be suppressed in the threading dislocation Q1.

3. N-side Superlattice Layer 3-1. Total Radiant Flux of Light-emitting Device

As described above, the pits K1 are generated in the n-side electrostatic breakdown preventing layer 140. Therefore, the pits K1 also exist in the n-side superlattice layer 150. In the n-side superlattice layer 150, when the In composition ratio and the total thickness of the InGaN layers 151 satisfy the following equation, the total radiant flux Po of the light-emitting device 100 is high.

$$0 < Y \leq 180X + 22 \quad (1\text{-}1)$$

$$0 < X \leq 0.1 \quad (1\text{-}2)$$

X: In composition ratio of InGaN layers
Y: Total thickness of InGaN layers (nm)

As described below, the total radiant flux Po of the semiconductor light-emitting device is high at this time (refer to region R1 of FIG. 9). That is, the semiconductor layer is almost never abnormally grown with the pits K1 expanding along with the growth of the semiconductor layer as starting points.

Furthermore, the In composition ratio and the total thickness of the InGaN layers 151 more preferably satisfy the following equation (refer to region R2 of FIG. 9). Thereby, the total radiant flux Po of the light-emitting device 100 is increased.

$$0 < Y \leq 180X + 19 \quad (2\text{-}1)$$

$$0.02 \leq X \leq 0.088 \quad (2\text{-}2)$$

X: In composition ratio of InGaN layers
Y: Total thickness of InGaN layers (nm)

3-2. Electrostatic Breakdown Voltage of Light-emitting Device

When the following equation is satisfied in addition to the above equations (1-1) and (2-1), the light-emitting device 100 has a high yield with respect to the electrostatic breakdown voltage.

$$20 \leq Y$$

Y: Total thickness of InGaN layers (nm)

That is, the InGaN layer 151 is preferably formed so as to have a thickness of not less than 20 nm.

Therefore, the equation (1-1) is preferably replaced with the following equation (3-1). The light-emitting device 100 exhibits excellent electrostatic breakdown voltage characteristics as well as high total radiant flux (refer to region R3 of FIG. 10).

$$20 \leq Y \leq 180X + 22 \quad (3\text{-}1)$$

$$0 < X \leq 0.1 \quad (3\text{-}2)$$

X: In composition ratio of InGaN layers
Y: Total thickness of InGaN layers (nm)

The equation (2-1) may be replaced with the following equation (4-1). The light-emitting device 100 exhibits excellent electrostatic breakdown voltage characteristics as well as high total radiant flux (refer to region R4 of FIG. 10).

$$20 \leq Y \leq 180X + 19 \quad (4\text{-}1)$$

$$0.02 \leq X \leq 0.088 \quad (4\text{-}2)$$

X: In composition ratio of InGaN layers
Y: Total thickness of InGaN layers (nm)

4. Method for Producing Semiconductor Light-emitting Device

Next will be described the method of the present embodiment for producing the light-emitting device 100. The production method includes forming an n-type semiconductor layer on a substrate, forming a light-emitting layer on the n-type semiconductor layer, and forming a p-type semiconductor layer on the light-emitting layer. The forming an n-type semiconductor layer includes forming an n-type contact layer, forming an n-side electrostatic breakdown preventing layer on the n-type contact layer, and forming an n-side superlattice layer on the n-side electrostatic breakdown preventing layer.

The semiconductor layers are formed through metal-organic chemical vapor deposition (MOCVD), whereby the semiconductor layers are produced via epitaxial growth. The carrier gas employed in the growth of semiconductor layers includes hydrogen ($H_2$), nitrogen ($N_2$), and a mixture of hydrogen and nitrogen ($H_2+N_2$). Ammonia gas ($NH_3$) is used as a nitrogen source, and trimethylgallium ($Ga(CH_3)_3$) is used as a gallium source. Trimethylindium ($In(CH_3)_3$) is used as an indium source, and trimethylaluminum ($Al(CH_3)_3$) is used as an aluminum source. Silane ($SiH_4$) is used as an n-type dopant gas, and bis(cyclopentadienyl)magnesium ($Mg(C_5H_5)_2$) is used as a p-type dopant gas. Any gas other than these may be employed.

4-1. Forming N-type Contact Layer

Firstly, a low-temperature buffer layer 120 is formed on the main surface of the substrate 110. Then, an n-type contact layer 130 is formed on the buffer layer 120. The substrate temperature in this process is 1,080° C. to 1,140° C.

4-2. Forming N-side Electrostatic Breakdown Preventing Layer

Figure 4:
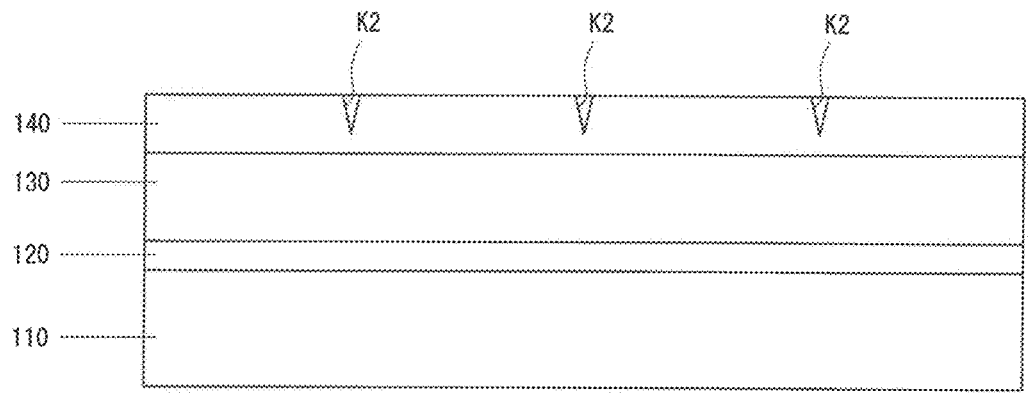
FIG. 4 is a sketch (part 1) for describing the method for producing the light-emitting device according to the embodiment.

Subsequently, an n-side electrostatic breakdown-preventing layer 140 is formed on the n-type contact layer 130. At that time, an n-type GaN layer 141, an n-type AlGaN layer 142, an ud-AlGaN layer 143, an ud-GaN layer 144, and an n-type GaN layer 145 are formed in this order. In this process, as shown in FIG. 4, pits K2 are generated with the n-type AlGaN layer 142 as starting points. To generate pits, the substrate temperature may be lowered in forming the n-type AlGaN layer 142. Therefore, the substrate temperature in forming the n-type AlGaN layer 142 is lower than the substrate temperature in forming the n-type GaN layer 141. The pits K2 are grown as the subsequent semiconductor layers are grown, resulting in pits K1. Thus, the n-side electrostatic breakdown preventing layer 140 is formed while forming the pits K2.

4-3. Forming N-side Superlattice Layer

Then, an n-side superlattice layer 150 is formed on the n-side electrostatic breakdown-preventing layer 140 by alternately depositing an InGaN layer 151 and a GaN layer 152. For that, the InGaN layer 151 is firstly formed on the n-type GaN layer 145 of the n-side electrostatic breakdown preventing layer 140. Subsequently, the GaN layer 152 is formed on the InGaN layer 151. Thus, a layer unit comprising the InGaN layer 151 and the GaN layer 152 is repeatedly deposited.

4-4. Forming Light-emitting Layer

Next, a light-emitting layer 160 is formed on the n-side superlattice layer 150. For that, a layer unit comprising a well layer 161, a capping layer 162, and a barrier layer 163 deposited in this order, is repeatedly deposited. That is, forming light-emitting layer comprises well layer formation step of forming a well layer 161, forming a capping layer 162 on the well layer, capping layer formation step of forming a capping layer 162 on the well layer 161, and barrier layer formation step of forming a barrier layer 163 on the capping layer 162. These steps are repeatedly carried out. Therefore, a well layer 161 is formed again on the barrier layer 163. The substrate temperature in growing the well layer 161 is adjusted to 730° C. to 850° C.

4-5. Forming P-type Cladding Layer

Then, a p-type cladding layer 170 is formed on the light-emitting layer 160 by repeatedly depositing a p-type InGaN layer 171 and a p-type AlGaN layer 172.

4-6. Forming P-type Contact Layer

Figure 5:
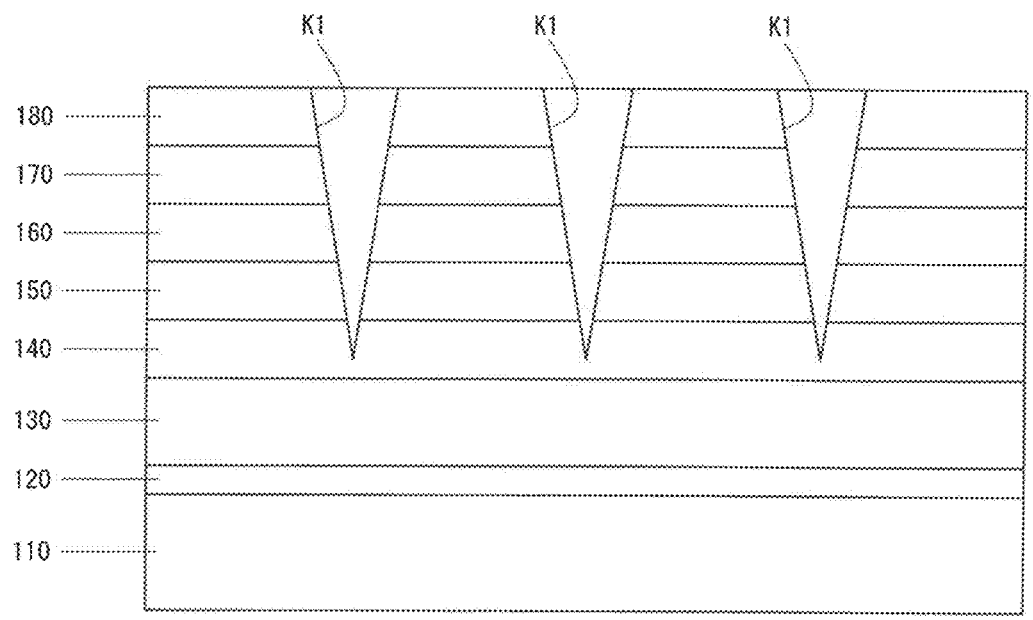
FIG. 5 is a sketch (part 2) for describing the method for producing the light-emitting device according to the embodiment.

Then, a p-type contact layer 180 is formed on the p-type cladding layer 170. The substrate temperature is adjusted to 900° C. to 1,050° C. Through the aforementioned steps, the semiconductor layers are deposited on the substrate 110 as shown in FIG. 5. At this time, the pits K1 are formed over a region reaching from the n-side electrostatic breakdown preventing layer 140 to the p-type contact layer 180.

4-7. Forming Transparent Electrode

Then, a transparent electrode 190 is formed on the p-type contact layer 180.

4-8. Forming Electrode

Then, a p-electrode P1 is formed on the transparent electrode 190. The semiconductor layers are partially removed through laser radiation or etching from the p-type contact layer 180 side, to thereby expose the n-type contact layer 130. Then, the n-electrode N1 is formed on the thus-exposed region. Either of forming p-electrode P1 and forming n-electrode N1 may be performed first.

4-9. Other Steps

In addition to the aforementioned steps, additional steps such as a heat treatment step and an insulating film formation step may be carried out. In this way, the light-emitting device 100 shown in FIG. 1 is produced.

5. Experiments

Samples 1 to 24 of light-emitting diode having a combination of the In composition ratio and the total thickness of InGaN layers shown in FIG. 9 were prepared. In FIGS. 6 to 10, the number assigned to each plot point is the sample No. The same number means the same sample.

5-1. Total Thickness of InGaN Layers in N-side Superlattice Layer and Total Radiant Flux The relationship between the total thickness and the total radiant flux was measured with samples varied in the total thickness of InGaN layers having an In composition ratio of 7.4%.

Figure 6:
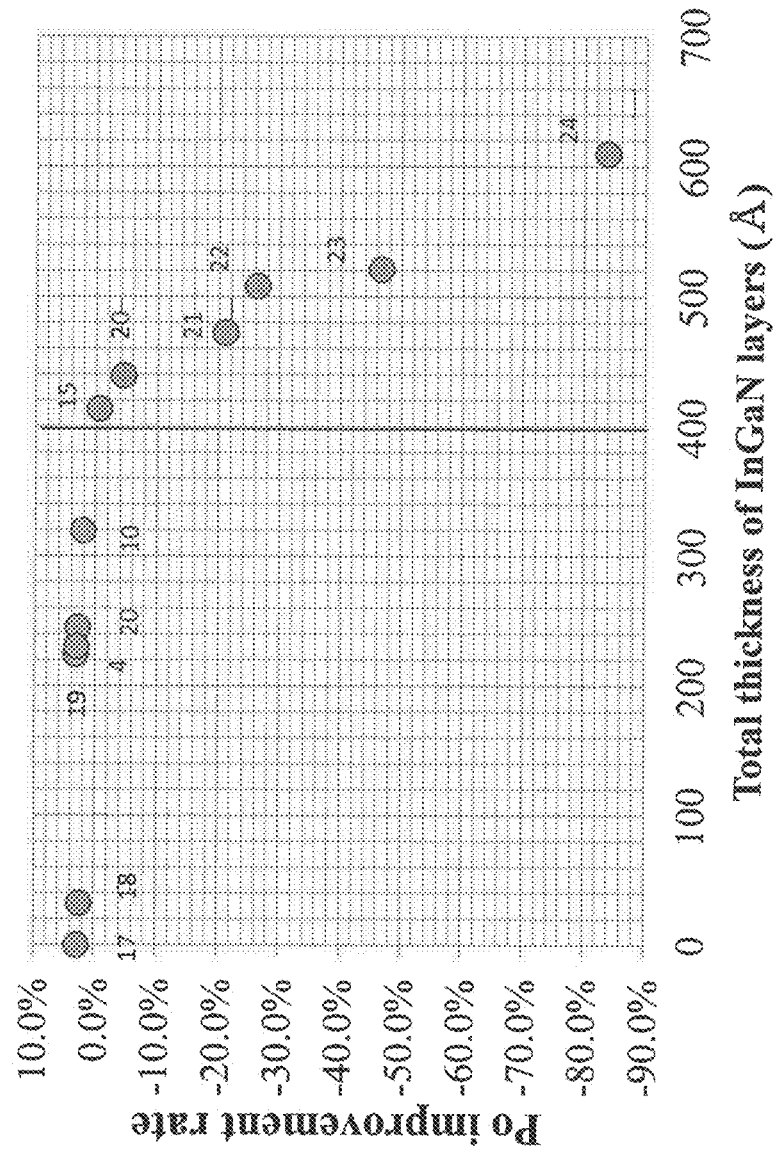
FIG. 6 is a graph showing the relationship between the total thickness of InGaN layers in the n-side superlattice layer and the total radiant flux.

FIG. 6 is a graph showing the relationship between the total thickness of the InGaN layers 151 in the n-side superlattice layer 150 and the total radiant flux. The horizontal axis of FIG. 6 indicates the total thickness (Å) of the plurality of InGaN layers 151 in the n-side superlattice layer 150. The vertical axis of FIG. 6 indicates the total radiant flux Po (a.u.) improvement rate of the light-emitting device having the above total thickness. When the value on the vertical axis is 0%, the total radiant flux Po is equivalent to that of the sample No. 15. That is, the vertical axis indicates the Po increase rate based on Po of the LED in which the total thickness of InGaN layers is 410 nm and the In composition ratio of InGaN layers is 7.4%.

As shown in FIG. 6, when the total thickness of the InGaN layers 151 is 0 Å to 400 Å (10 Å=1 nm), the total radiant flux Po of the light-emitting device is improved by 2% or more. When the total thickness of the InGaN layers 151 exceeds 400 Å, the total radiant flux Po of the light-emitting device is reduced. When the total thickness of the InGaN layers 151 is too large, comparatively large compression stress is applied to the InGaN layers 151. Thereby, misfit dislocations were generated in the InGaN layer 151. By the propagation of the misfit dislocations to the light-emitting layer 160, carriers were lost and the total radiant flux Po was reduced.

5-2. Total Thickness of InGaN Layers in N-side Superlattice Layer and Electrostatic Breakdown Voltage With the above samples, the relationship between the total thickness of InGaN layers having an In composition ratio of 7.4% and the electrostatic breakdown voltage was measured.

Figure 7:
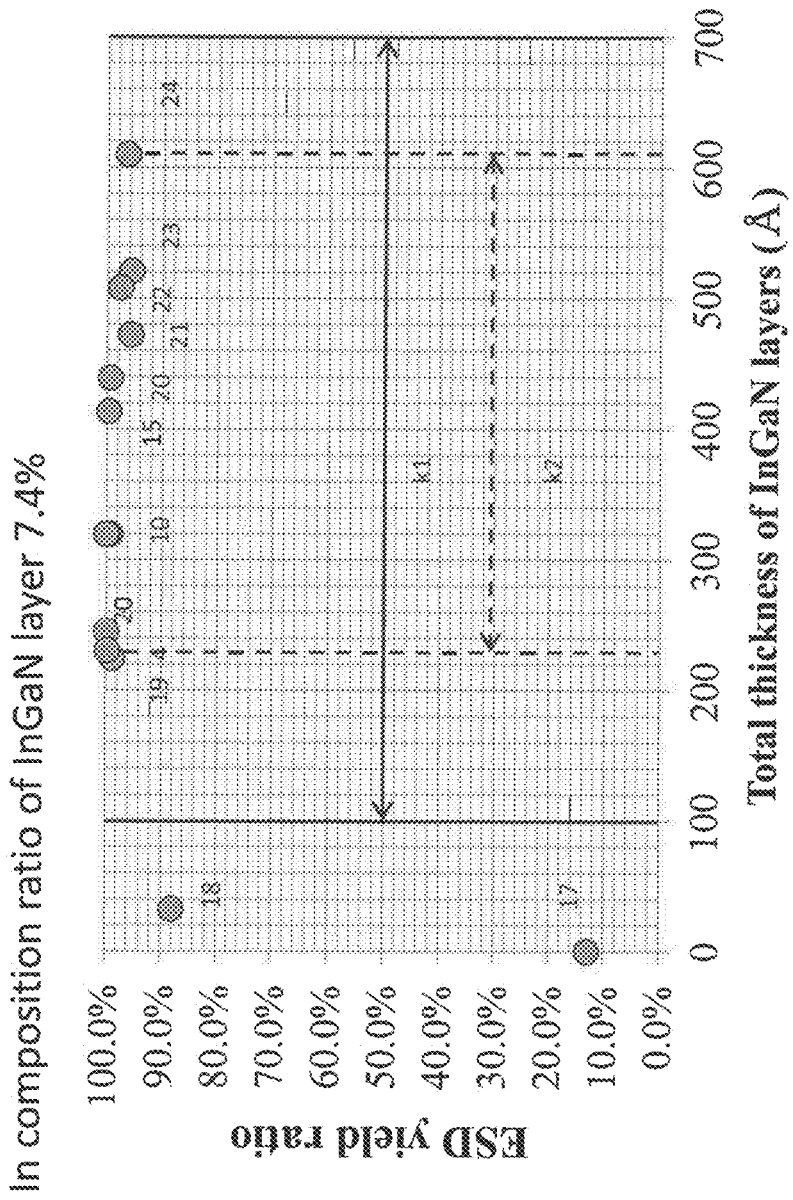
FIG. 7 is a graph showing the relationship between the total thickness of InGaN layers in the n-side superlattice layer and the ESD yield ratio.

FIG. 7 is a graph showing the relationship between the total thickness of the InGaN layers 151 of the n-side superlattice layer 150 and the electrostatic breakdown voltage. The horizontal axis of FIG. 7 indicates the total thickness (Å) of the plurality of InGaN layers 151 in the n-side superlattice layer 150. The vertical axis of FIG. 7 indicates the yield ratio (%) with respect to the electrostatic breakdown voltage of the light-emitting device having the above total thickness.

As shown in FIG. 7, when the total thickness of InGaN layers 151 is 100 Å to 700 Å, the yield ratio with respect to the electrostatic breakdown voltage is 90% or more (refer to region K1 of FIG. 7). The lower limit 100 Å of the total thickness is predicted when the EDS yield ratio is 90% in the characteristics of FIG. 7. The lower limit was determined by interpolating the characteristics. The upper limit 700 Å of the total thickness was determined by extrapolating the characteristics when the ESD yield ratio is 90%. When the total thickness of InGaN layers 151 is 200 Å to 600 Å, the yield ratio with respect to the electrostatic breakdown voltage is 95% or more (refer to region K2 of FIG. 7). In the region K2, the measured total thickness of InGaN layers is 230 Å to 610 Å.

That is, the yield ratio with respect to the electrostatic breakdown voltage is 95% or more when the following equation is satisfied.

$$20 \leq Y \leq 60 \quad (5)$$

Y: Total thickness of InGaN layers (nm)

5-3. Relationship Among In Composition Ratio and Thickness of InGaN Layers In N-side Superlattice Layer and Total Radiant Flux The relationship between the In composition ratio X and the total radiant flux Po was measured respectively when the total thickness of InGaN layers is 230 Å, 320 Å, and 410 Å. The measurement results are shown in FIG. 8.

Figure 8:
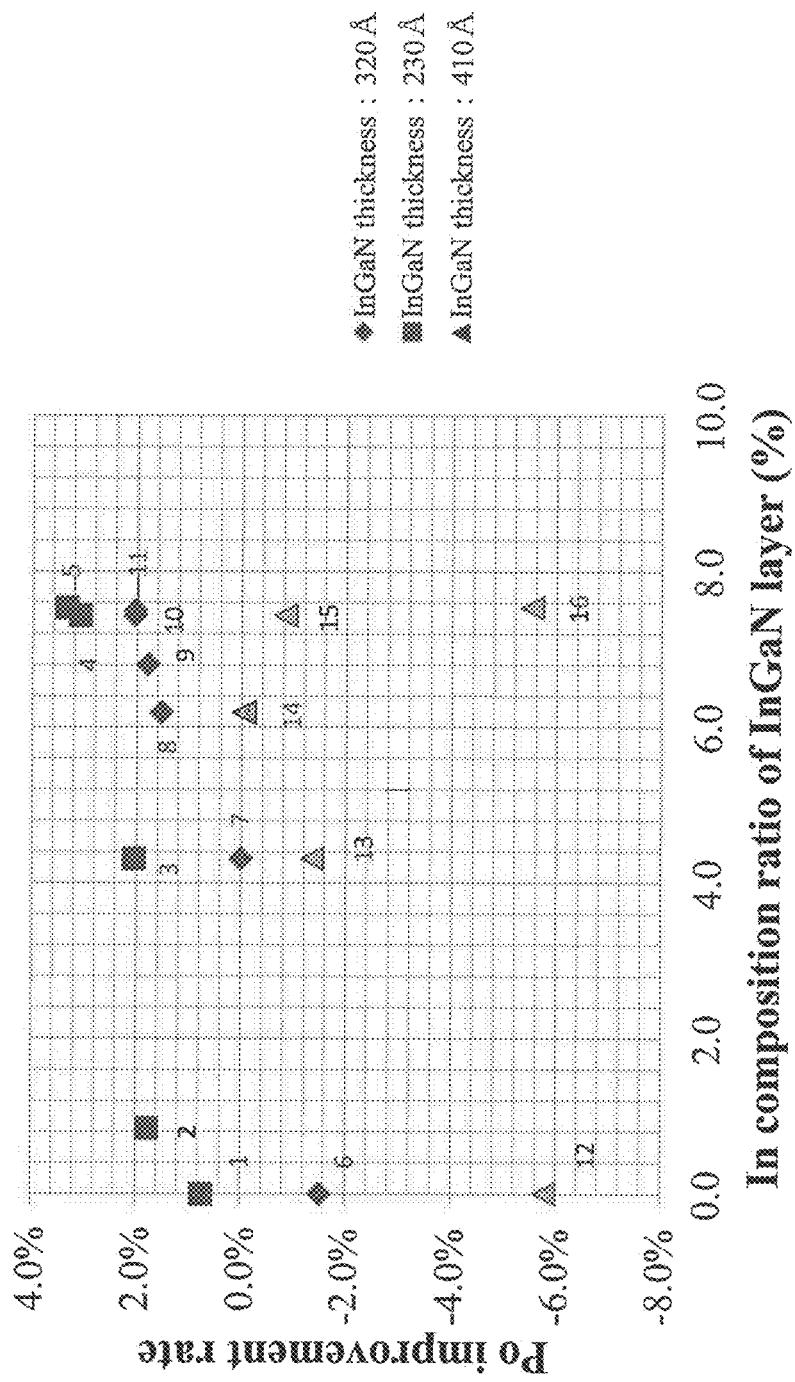
FIG. 8 is a graph showing the relationship between the measured total radiant flux and the In composition ratio of InGaN layer in the samples in which the total thickness of InGaN layers is 230 nm, 320 nm, and 410 nm.

The plot points of FIGS. 9 and 10 indicate all the plot points of FIGS. 6 and 8. FIGS. 9 and 10 show the improvement rate of total radiant flux shown in FIGS. 6 and 8 in three stages of 2.0% or more, 0 to 2.0%, and 0% or less (no improvement)

FIG. 9 is a graph (part 1) showing the relationship among the In composition ratio and the total thickness of InGaN layers 151 in the n-side superlattice layer 150 and the total radiant flux. Line A of FIG. 9 indicates Y=180X+22. The horizontal axis of FIG. 9 indicates the In composition ratio (%) of InGaN layers 151 in the n-side superlattice layer 150. The vertical axis of FIG. 9 indicates the total thickness (Å) of the plurality of InGaN layers 151 in the n-side superlattice layer 150. The regions R1 and R2 of FIG. 9 are the region defined by the equations (1-1), (1-2) and (2-1), (2-2), respectively.

As shown in FIG. 9 reflecting the results of FIGS. 6 and 8, inside the region R1, the total radiant flux Po improvement rate of the light-emitting device is 0% or more. Inside the region R2, the total radiant flux Po improvement rate of the light-emitting device is 2% or more (refer to diamond shaped data points in FIG. 9). The region R2 is included inside the region R1. That is, outside the region R2 inside the region R1, the total radiant flux Po improvement rate of the light-emitting device is more than 0% and less than 2% (refer to triangle shaped data points in FIG. 9).

The inside area of the region R1 is expressed by the above-mentioned equations (1-1) and (1-2). At this time, the total radiant flux Po improvement rate is relatively large.

The inside area of the region R2 is expressed by the above-mentioned equations (2-1) and (2-2). When the equations (2-1) and (2-2) are satisfied, the total radiant flux Po improvement rate of the light-emitting device is 2% or more.

FIG. 10 is a graph (part 2) showing the relationship among the In composition ratio and the total thickness of InGaN layers 151 in the n-side superlattice layer 150 and the total radiant flux. The horizontal axis and the vertical axis of FIG. 10 indicate the same as of FIG. 9. FIG. 10 is a graph considering the equations (3-1) and (3-2) into the result of FIG. 9. The regions R3 and R4 of FIG. 10 are obtained by reflecting the result of FIG. 7 where the ESD yield ratio is 95% or more in the regions R1 and R2. That is, the total thickness of InGaN layers is 20 nm or more, and the measured total thickness is 23 nm or more to obtain the ESD yield ratio of 95%.

The regions R3 and R4 are drawn in FIG. 10. Outside the region R4 inside the region R3, the total radiant flux Po improvement rate of the light-emitting device is more than 0% and less than 2%, and the yield ratio (%) with respect to the electrostatic breakdown voltage is 95% or more. The region R3 is expressed by the above-mentioned equations (3-1) and (3-2).

Inside the region R4, the total radiant flux Po improvement rate of the light-emitting device is 2% or more, and the yield ratio with respect to the electrostatic breakdown voltage is 95% or more. The region R4 is expressed by the above-mentioned equations (4-1) and (4-2).

6. Variations 6-1. GaN Layer of N-side Superlattice Layer

The n-side superlattice layer 150 is formed by repeatedly depositing layer units, each layer unit comprising an InGaN layer 151 and a GaN layer 152. However, instead of the GaN layer 152, an n-type GaN layer, an InGaN layer, and an n-type InGaN layer may be used. In this case, the GaN layer 152, the n-type GaN layer, the InGaN layer, and the n-type InGaN layer have an In composition ratio lower than that of the InGaN layer 151. That is, the n-side superlattice layer is formed by alternately depositing a first InGaN layer and a second InGaN layer having an In composition ratio lower than that of the GaN layer or the first InGaN layer. Even in this case, the n-side superlattice layer can sufficiently relax the stress applied to the light-emitting layer 160.

6-2. Filling Pits

In the present embodiment, the pits K1 reach from the n-side electrostatic breakdown preventing layer 140 to the p-type contact layer 180. However, the pits may be filled when they reached the p-type cladding layer 170. The pits K1 are still formed so as to reach from the n-type semiconductor layer to the p-type semiconductor layer. In this way, the pits K1 may be filled in the middle of the p-type semiconductor layer.

6-3. Light-emitting Layer

In the present embodiment, the light-emitting layer 160 is formed by repeatedly depositing layer units, each layer unit comprising a well layer 161, a capping layer 162, and a barrier layer 163. However, the capping layer 162 may be omitted. In that case, the well layer 161 and the barrier layer 163 may be repeatedly deposited as a layer unit.

6-4. Flip-chip

The light-emitting device 100 according to the present embodiment is a face-up type light-emitting device. However, the present techniques of the present embodiment may be applied to a flip-chip type light-emitting device.

6-5. N-side Electrostatic Breakdown Preventing Layer

In the present embodiment, the n-side electrostatic breakdown preventing layer 140 has a five-layered structure. However, other structure may be employed. For example, the n-side electrostatic breakdown preventing layer may have a two-layered structure of an i-GaN layer and an n-type GaN layer. However, even in that case, the starting points J1 of the pits K1 exist in the n-side electrostatic breakdown preventing layer.

6-6. Emission Wavelength

In the present embodiment, light emitted from the light-emitting layer 160 has an emission wavelength of 430 nm to 470 nm. However, needless to say, other emission wavelength may be employed.

6-7. Combination

The above variations may be freely combined.

7. Summary of the Embodiment

As described above in detail, in the light-emitting device 100 of the present embodiment, the n-side superlattice layer 150 is formed by repeatedly depositing an InGaN layer 151 and a GaN layer 152 having an In composition ratio lower than that of the InGaN layer 151. The total thickness and the In composition ratio of the InGaN layers 151 satisfy the equation (1). Thus, a sufficiently bright semiconductor light-emitting device is achieved while suppressing abnormal growth of the semiconductor layer with the pits as starting points.

The above-described embodiment is merely an example. Accordingly, needless to say, the embodiment may be improved or modified in various ways without departing from the scope of the present invention. The deposition structure of the layered body is not necessarily limited to the above-illustrated structure. The deposition structure, the number of repetitions of layers, etc. may be freely selected. The vapor deposition method is not limited to the metal organic chemical vapor deposition (MOCVD). Any other vapor deposition method may be used so long as it uses a carrier gas to grow crystals. The semiconductor layers may be formed through another epitaxial growth method such as liquid-phase epitaxy or molecular beam epitaxy.

What is claimed is:

1. A method for producing a Group III nitride semiconductor light-emitting device, the method comprising:
    forming an n-type semiconductor layer on a substrate;
    forming a light-emitting layer on the n-type semiconductor layer;
    forming a p-type semiconductor layer on the light-emitting layer;
    wherein the forming an n-type semiconductor layer comprises:
        forming an n-type contact layer;
        forming an n-side electrostatic breakdown preventing layer on the n-type contact layer; and
        forming an n-side superlattice layer on the n-side electrostatic breakdown preventing layer;
    wherein in the forming an n-side electrostatic breakdown preventing layer, a plurality of pits is generated from the n-side electrostatic breakdown preventing layer;
    in the forming an n-side superlattice layer, the layer is formed by alternately depositing a first InGaN layer, and an other layer comprising at least one member selected from a group consisting of a GaN layer and a second InGaN layer having an In composition ratio lower than that of the first InGaN layer, so that the In composition ratio and the total thickness of the first InGaN layers satisfy the following equation and the total thickness of the first InGaN layers is not less than 20 nm, thereby the n-side superlattice layer is prevented from abnormally growing from the pits:

$0 < Y \leq 180X + 22$ $0 < X \leq 0.1$

X: In composition ratio of first InGaN layers
Y: Total thickness of first InGaN layers (nm).

2. The method for producing the Group III nitride semiconductor light-emitting device according to claim 1, wherein in the forming an n-side superlattice layer, the In composition ratio and the total thickness of the first InGaN layers satisfy the following equation:

$0 < Y \leq 180X + 19$ $0.02 \leq X \leq 0.088$.

3. The method for producing the Group III nitride semiconductor light-emitting device according to claim 1, wherein in the forming an n-side superlattice layer, the other layer comprises an n-type GaN layer, an InGaN layer, and an n-type InGaN layer.

4. The method for producing the Group III nitride semiconductor light-emitting device according to claim 2, wherein in the forming an n-side superlattice layer, the other layer comprises an n-type GaN layer, an InGaN layer, and an n-type InGaN layer.

5. The method for producing the Group III nitride semiconductor light-emitting device according to claim 1, wherein in the forming an n-side electrostatic breakdown preventing layer, the average pit diameter at an interface between the n-side electrostatic breakdown preventing layer and the n-side superlattice layer is 120 nm to 200 nm.

6. The method for producing the Group III nitride semiconductor light-emitting device according to claim 2, wherein in the forming an n-side electrostatic breakdown preventing layer, the average pit diameter at an interface between the n-side electrostatic breakdown preventing layer and the n-side superlattice layer is 120 nm to 200 nm.

7. The method for producing the Group III nitride semiconductor light-emitting device according to claim 1, wherein in the forming an n-side electrostatic breakdown preventing layer, the pit density at an interface between the n-side electrostatic breakdown preventing layer and the n-side superlattice layer is $1.0 \times 10^8$ cm$^{-3}$ to $4.0 \times 10^8$ cm$^{-3}$.

8. The method for producing the Group III nitride semiconductor light-emitting device according to claim 1, wherein the wavelength of light emitted from the light-emitting layer is 430 nm to 470 nm.

9. A Group III nitride semiconductor light-emitting device comprising an n-type semiconductor layer on a substrate, a light-emitting layer on the n-type semiconductor layer, and a p-type semiconductor layer on the light-emitting layer,
    wherein the n-type semiconductor layer comprises an n-type contact layer, an n-side electrostatic breakdown preventing layer, and an n-side superlattice layer in this order on the substrate;
    at least the n-type semiconductor layer and the light-emitting layer have a plurality of pits starting from the n-side electrostatic breakdown preventing layer;
    the n-side superlattice layer comprises repeated layer units, each layer unit comprising a first InGaN layer, and an other comprising at least one member selected from a group consisting of a GaN layer and a second InGaN layer having an In composition ratio lower than that of the first InGaN layer;
    the In composition ratio and the total thickness of the first InGaN layers satisfy the following equation and the total thickness of the first InGan layers is not less than 20 nm, and the n-side superlattice layer does not comprise a portion which abnormally grows from the pits:

$0 < Y \leq 180X + 22$ $0 < X \leq 0.1$

X: In composition ratio of first InGaN layers
Y: Total thickness of first InGaN layers (nm).

10. The Group III nitride semiconductor light-emitting device according to claim 9, wherein the In composition ratio and the total thickness of the first InGaN layers satisfy the following equation:

$0 < Y \leq 180X + 19$ $0.02 \leq X \leq 0.088$.

11. The Group III nitride semiconductor light-emitting device according to claim 9, wherein the other layer comprises an n-type GaN layer, an InGaN layer, and an n-type InGan layer.

12. The Group III nitride semiconductor light-emitting device according to claim 10, wherein the other layer comprises an n-type GaN layer, ab InGaN layer, and an n-type InGaN layer.

* * * * *